(12) United States Patent
Greiser et al.

(10) Patent No.: US 8,466,677 B2
(45) Date of Patent: Jun. 18, 2013

(54) METHOD AND MAGNETIC RESONANCE DEVICE TO DETERMINE A BACKGROUND PHASE CURVE

(75) Inventors: Andreas Greiser, Erlangen (DE); Arne Littmann, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 335 days.

(21) Appl. No.: 13/014,840

(22) Filed: Jan. 27, 2011

(65) Prior Publication Data

US 2011/0188721 A1  Aug. 4, 2011

(30) Foreign Application Priority Data

Feb. 3, 2010  (DE) .................... 10 2010 001 552

(51) Int. Cl.
*G01V 3/00*  (2006.01)
(52) U.S. Cl.
USPC .................................... 324/306; 324/309
(58) Field of Classification Search
USPC ................... 324/306, 307, 309, 314
See application file for complete search history.

(56) References Cited

U.S. PATENT DOCUMENTS

| | | | |
|---|---|---|---|
| 4,752,734 A * | 6/1988 | Wedeen | 324/306 |
| 6,342,785 B1 | 1/2002 | Heid | |
| 7,515,742 B2 * | 4/2009 | Zhao et al. | 382/128 |
| 7,755,355 B2 * | 7/2010 | Polzin | 324/306 |
| 7,847,545 B2 * | 12/2010 | Wiesinger et al. | 324/306 |
| 8,154,287 B2 * | 4/2012 | Edelman et al. | 324/309 |
| 8,344,730 B2 * | 1/2013 | Kimura | 324/318 |
| 2008/0054900 A1 | 3/2008 | Polzin | |

OTHER PUBLICATIONS

"Correction of Phase Offset Errors in Main Pulmonary Artery Flow Quantification," Lankhaar et al. Journal of Magnetic Resonance Imaging, vol. 22 (2005) pp. 73-79.

* cited by examiner

*Primary Examiner* — Louis Arana
(74) *Attorney, Agent, or Firm* — Schiff Hardin LLP

(57) ABSTRACT

In a magnetic resonance (MR) device and method to determine a background phase curve in MR image data, in first MR image data and in second MR image data that respectively represent different segments (for example different slices) of an examination subject, first and second pixels are identified that represent essentially stationary tissue, and the associated phase values are determined. Phase correction values for the first MR image data are determined depending on the phase values determined for the first and second pixels that represent essentially stationary tissue.

18 Claims, 5 Drawing Sheets

METHOD AND MAGNETIC RESONANCE DEVICE TO DETERMINE A BACKGROUND PHASE CURVE

BACKGROUND OF THE INVENTION

1. Field of the Invention

The present invention concerns a method to determine a background phase curve in magnetic resonance (MR) image data and a magnetic resonance device that implements such a method. The invention in particular concerns such a method and such a device with which a background phase curve can be determined in a phase-sensitive flow measurement or in an angiography procedure.

2. Description of the Prior Art

Different methods that allow the determination of flow or movement velocities of tissue using imaging MR techniques are known and described, for example by Heinz Morneburg (Ed.), "Bildgebende Systeme für die medizinische Diagnostik" ["Imaging Systems for Medical Diagnostics"], 3rd Edition, 1995, Publicis MCD Verlag, Erlangen. In order to acquire velocity information, for example, magnetic field gradients can be shifted that cause a velocity-dependent contribution to the phase of the spins or, respectively, the magnetic moment, and thus lead to a phase coding of the velocities. Conclusions as to the velocity at the corresponding point of the examination subject can then be drawn from the phase associated with a pixel in the MR image data. Such a method is described in DE 198 36 592 A1, for example.

Background phase effects can impair the precision of such measurements since the background phase of the velocity-dependent phase information is overlaid. Such background phase effects can have various causes. For example, given phase-sensitive flow measurements or phase contrast flow measurements conducted with an MR device, bipolar gradients can be shifted to code a flow of liquid tissues, for example of blood. The temporally variable gradient fields can lead to induction currents and eddy current effects in the coil geometry of the MR device. Even if induction currents can be at least partially accounted for in the computational evaluation of the measured signals, the eddy current effects can lead to a background phase, for example, which background phase overlays the actual velocity information given MR image data that contain a velocity information (and are also called phase images) and can lead to an adulteration of the flow velocity that is determined in this manner. Another source for background phases can exist in gradient nonlinearities. Independent of their origin, the background phase can lead to quantitative adulterations.

Different approaches can be taken in order to determine a background phase curve. One approach is to repeat a measurement with a suitable phantom that is modeled depending on the shape of the examination subject in order to enable the measurement of phase values at stationary points and to thus determine the background phase. However, such a repetition is normally complicated. An additional approach exists in the formation of tables of background phase values. However, since such a table formation can typically take place only for a specific number of sets of measurement parameters, it would be necessary to either correspondingly limit the parameter space that can be used in the measurement or to interpolate between the table values. Time variations of the MR device can lead to the situation that the quality of the correction decreases over time, even under consideration of these limitations.

In J. W. Lankhaar et al., "Correction of phase offset errors in main pulmonary artery flow quantification", J Magn Reson Imaging 2005; 22(1):73-9, a correction method for correction of background phase effects is described in which points that correspond to essentially stationary tissue are identified in MR image data that represent a slice of the examination subject. A curve of the background phase is determined by an interpolation, depending on the phase values for the stationary pixels. An image-based correction takes place in this way in the sense that the information necessary to determine the background phase is determined from the MR image data themselves that represent the slice. For example, even if a constant phase offset can already theoretically be corrected when at least one stationary pixel can be identified, due to signal noise a greater number and a suitable distribution of stationary pixels in the MR image data are typically required in order to reasonably correct the MR image data. The method described by J. W. Lankhaar et al. thus can not always be implemented for slices in which only a small number of stationary points are present, or cannot always be implemented with acceptable precision.

Due to the increasing importance of flow measurements with volumetric coverage—for example in "4D flow" images in which a velocity information is determined in a three-dimensional space over time—a need exists for methods and devices that allow the curve of the background phase to be determined.

SUMMARY OF THE INVENTION

An object of the present invention is based to provide an improved method and an improved device with which the curve of the background phase can be determined. In particular, an object of the invention is to specify a method and a device that allow a reliable determination of the background phase curve without repetition of the measurement on a sample body.

The method according to the invention determines a background phase curve in MR image data of an examination subject, the MR image data being determined using a phase-sensitive magnetic resonance (MR) measurement. For this purpose, in accordance with the invention phase correction values are determined depending on first and second MR image data that respectively represent different first and second segments of the examination subject. In the method at least one first phase value is determined in the first MR image data for at least one first pixel that represents essentially stationary tissue. At least one second phase value for at least one second pixel that represents essentially stationary tissue is determined in the second MR image data. Phase correction values for the first MR image data are determined depending on both the at least one first phase value and the at least one second phase value.

In the method the phase correction values for the first MR image data are determined depending on first and second MR image data that represent different segments of the examination subject. Additional information about the background phase curve are used via the utilization of the at least one second phase value to determine the phase correction values. The background phase curve can thus be reliably determined, even if only a few pixels (for example only one pixel) that represent essentially stationary tissue are present in the first MR image data.

A pixel in which tissue of the examination subject is imaged whose velocity is less than a threshold is thereby understood as a "pixel that represents essentially stationary tissue". The velocity of the "essentially stationary tissue" does not need to be exactly equal to zero. The determination of at least one phase value for "essentially stationary tissue" can contain the determination of a phase value for stationary tissue.

The pixels that represent essentially stationary tissue can be identified in different ways in the first and second MR image data. According to one exemplary embodiment, the first MR image data can comprise multiple time-sequential images of the first segment of the examination subject in the manner of a cine image sequence, wherein the pixel or, respectively, pixels that represent(s) essentially stationary tissue is/are determined in that the time variance of the phase is determined for each of the pixels of the first MR image data and is compared with a threshold. The threshold can be fixed or can be selected such that at least one specific portion of pixels of the first MR image data is identified as pixels that represent essentially stationary tissue. According to a further exemplary embodiment, cross-correlations between different pixels can be evaluated in order to determine the pixels that represent essentially stationary tissue. According to a further exemplary embodiment, the pixels that represent essentially stationary tissue are determined via a comparison of the phase values of the pixels of the first MR image data with a threshold. According to a further exemplary embodiment, the pixels that represent essentially stationary tissue can be identified using the anatomy of the examination subject. The identification of the pixel or pixels that represent essentially stationary tissue in the second image data can likewise ensue as described above.

The first and second MR image data can be such that they represent first or, respectively, second slices of the examination subject that are different from one another. The slices can be offset relative to one another in the axial direction of the examination subject and/or along the longitudinal direction of a vessel; they can also be spaced apart from one another. The determination of the background phase curve is thereby facilitated in the measurement geometry that is typical given flow measurements or angiography.

The phase correction values can advantageously be determined so that they approximate the curve of the background phase. In particular, the at least one first pixel can be a number of first pixels, in particular at least three first pixels that represent essentially stationary tissue, and the at least one second pixel can be a number of second pixels, in particular at least three second pixels, that represent essentially stationary tissue. The phase correction values can then be determined depending on the first phase values, the coordinates of the first pixels in the first MR image data, the second phase values and the coordinates of the second pixels in the second MR image data.

In order to determine the phase correction values, depending on the at least one first phase value and the at least one second phase value at least one fit function can be determined. An interpolation can thereby be conducted between the first and second phase values that are determined for the first and second pixels. The fit delivers an estimation of the background phase curve.

A first fit function can be determined depending on the at least one first phase value and a second fit function can be determined depending on the at least one second phase value. The phase correction values can be determined depending on the first fit function and the second fit function. The information that is obtained from different MR image data can thereby be combined in a suitable manner.

An order of the fit functions, i.e. the number of terms and coefficients that are to be established, can respectively be selected depending on a number and/or distribution of the pixels that correspond to essentially stationary tissue.

The first MR image data and the second MR image data can possess multiple (in particular at least three pixels) that correspond to essentially stationary tissue. Respective linear functions of the two coordinates of the image plane whose parameters are established depending on the phase values and coordinates of the pixels that correspond to essentially stationary tissue can then be selected as first fit function and second fit function. Spatial variations of the background phase can be taken into account in this way. Given a correspondingly higher number of first pixels that correspond to essentially stationary tissue, or of second pixels that correspond to essentially stationary tissue, a function of higher order can also be selected in the coordinates as a first fit function or, respectively, second fit function.

The determination of the phase correction values can comprise an averaging of the first fit function and the second fit function. The stability of the determined phase correction values can thereby be increased.

The method can generally be applied to more than two sets of MR image data. In particular, at least one additional pixel that represents essentially stationary tissue can respectively be identified in the MR image data and at least one additional phase value that is associated with the at least one additional pixel can respectively be determined for at least one additional set of MR image data that represent at least one additional segment of the examination subject that is different from the first and second segment. The phase correction values can be determined depending on the at least one first phase value, the at least one second phase value and the at least one additional phase value. By using MR image data that represent a greater number of segments of the examination subject that are different from one another (in particular more than two slices that are different from one another), it is possible to estimate the background phase curve more precisely with the determined phase correction values.

The different MR image data that represent different segments (in particular different slices) of an examination subject can be acquired in a slice by slice measurement with volumetric coverage of the examination subject. Not only are the multiple MR image data provided that are used for a more stable estimation of the background phase curve, but also a 3D or 4D flow representation can be obtained from the acquired data.

The phase correction values can be determined at least for pixels in the first MR image data and/or in the second MR image data that do not represent essentially stationary tissue. This can ensue via evaluation of an averaged fit function at the pixels that do not represent essentially stationary tissue. An estimation of the background phase can thereby be conducted at least for the pixels at which the phase is an overlay of a velocity-dependent phase and a background phase. The phase correction values can also be determined for all pixels, for example by evaluation of an averaged fit function.

The determined phase correction values can be used in order to implement a phase correction of the first MR image data and the second MR image data. For this the phase correction value that is evaluated at the respective image coordinates can be subtracted for all pixels of the first MR image data and for all pixels of the second MR image data. A correction of the first MR image data and second MR image data is thereby achieved with regard to the background phase. The phase correction values can also be applied to more than two sets of MR image data.

The method to determine the background phase curve can be used to correct MR image data in a phase-sensitive flow measurement or angiography. For this a flow profile can be determined depending on the phase-corrected first MR image data and/or second MR image data. The precision of the velocity determination in the phase-sensitive flow measurement or angiography can thereby be increased.

In order to generate the first and second MR image data, with an MR device a first data acquisition on the basis of which the first MR image data are determined and a second data acquisition on the basis of which the second MR image data are determined can be implemented such that a distance (spacing or interval) between a position of the first segment (for example a first slice) of the examination subject in the first data acquisition and a position of the second segment (for example a second slice) of the examination subject in the second data acquisition is smaller than a predetermined threshold. The positions of the first segment and the second segment can thereby be determined by the positions of the volume or area middle points. The threshold (for example 6 cm) can be selected depending on the MR device that is used for data acquisition, such that the background phase curve changes only slightly in a measurement volume that has a length equal to the threshold in the axial direction of the MR device and is centered on the isocenter of the MR device. The threshold (for example 6 cm) can be selected depending on the MR device used for data acquisition so that in the partial volume of the measurement space (which has a length equal to the threshold in the axial direction of the MR device and is centered at the isocenter of the MR device) the variation of the background phase as a function of the axial position in the MR device is less than a predetermined value for each of the pixels. It can thereby be achieved that those first MR image data and second MR image data that exhibit a curve of the background phase that is similar or essentially identical are used to determine the background phase curve that is determined from multiple sets of MR image data.

In order to generate the first and second MR image data, with an MR device a first data acquisition (on whose basis the first MR image data are determined) and a second data acquisition (on whose basis the second MR image data are determined) are implemented such that the examination subject is moved relative to the MR device between the first data acquisition and the second data acquisition. The movement can take place in an axial direction of the MR device. The examination subject can be moved by a distance that is essentially equal to the separation of the volume or area middle points of the first and second segment. The first data acquisition and the second data acquisition can be implemented at positions relative to the MR device that have a background phase curve that is similar or essentially identical to a high degree.

In order to generate the first and second MR image data, a first data acquisition (on the basis of which the first MR image data are determined) and a second data acquisition (on the basis of which the second MR image data are determined) can be implemented with an MR device such that in the first data acquisition the first segment of the examination subject is arranged in an environment of the isocenter of the MR device, and such that in the second data acquisition the second segment of the examination subject is arranged in an environment of the isocenter of the MR device. The environment of the isocenter can be defined such that the separation of the volume or area center point of the first segment or, respectively, of the second segment of the examination subject from the isocenter is less than a predetermined threshold (for example smaller than 3 cm). The background phase curve can thereby be determined on the basis of MR image data that were determined based on measurements in a region with good magnetic field homogeneity.

The first data acquisition and the second data acquisition can take place with a pulse sequence for a phase-sensitive flow measurement or angiography. The first and second data acquisition can respectively be implemented with a two-dimensional measurement (two-dimensional k-space). A phase-corrected flow profile in the imaged slices can thereby be determined.

The invention also encompasses a non-transitory computer-readable storage medium in which a command sequence is stored that causes an electronic computer (processor) to implement the method according to all exemplary embodiments. For example, the storage medium can be loadable into the memory of an evaluation computer of an MR device. The command sequence (programming instructions) can exist as a source code or as a compiled command sequence.

For example, the storage medium can be a CD-ROM, a DVD, a magnetic tape, a flash memory or a USB stick on which the programming instructions are stored as electronically readable control information.

According to a further aspect of the invention, a magnetic resonance device has an MR data acquisition device to acquire first data and second data with a phase-sensitive magnetic resonance (MR) measurement (data acquisition procedure), wherein the first data and second data represent segments of an examination subject that differ from one another, and said magnetic resonance device also comprises a computer. The computer configured to determine first MR image data depending on the first data and second MR image data depending on the second data, and in order to determine phase correction values for the MR image data. The computer is configured to determine the phase correction values of at least one first phase value for at least one first pixel that represents essentially stationary tissue in the first MR image data; and to determine at least one second phase value for at least one second pixel that represents essentially stationary tissue in the second MR image data; and to determine the phase correction values for the first MR image data depending on the at least one first phase value and the at least one second phase value.

In the device the phase correction values for the first MR image data are determined depending on first and second MR image data that represent different segments of the examination subject. Additional information about the background phase curve is utilized via the use of the at least one second phase value to determine the phase correction values. The background phase curve can thus be reliably determined, even if only a few pixels—for example only one pixel—that represent the essentially stationary tissue are present in the first MR image data.

The MR device can be configured so that the first and second MR image data respectively represent first and second slices of the examination subject that differ from one another. The slices can be offset relative to one another in an axial direction of the examination subject and/or along the longitudinal direction of a vessel. The background phase correction is thereby facilitated in the measurement geometry that is typical in flow measurements or in angiography. The MR device can thus be configured so that the data acquisition for the different slices can ensue in a per-slice measurement with volumetric coverage.

The computer can be configured to determine the phase correction values according to the methods that were described for the method according to the aspects or exemplary embodiments of the invention. In particular, the computer can be configured to determine a first fit function based on first phase values and coordinates of a number of first pixels that represent essentially stationary tissue; in order to determine a second fit function based on second phase values and coordinates of a plurality of second pixels that represent essentially stationary tissue; and to determine the phase correction values for the first MR image data depending on the first fit function and the second fit function. The computer can be configured so that the phase correction values that are determined in this way also serve as phase correction values for the second MR image data. A background phase correction can also be implemented for MR image data that themselves exhibit only a small number of pixels that correspond to essentially stationary tissue.

The MR device can have a control device that is configured to move a support device—which serves to support the examination subject between a first data acquisition on the basis of which the first MR image data are determined) and a second data acquisition (on the basis of which the second MR image data are determined)—relative to a coil arrangement of the MR device.

Although the operation of the MR device is described above with regard to first and second MR image data, the MR device can additionally use the phase values and coordinates of pixels that correspond to essentially stationary tissue in additional sets of MR image data in order to determine the phase correction values. The phase correction values can be used for background phase correction in the first and second MR image data and the additional sets of MR image data.

The present invention is particularly suitable for a phase-sensitive flow measurement or angiography procedure implemented by an MR device, but without being limited to these applications.

DESCRIPTION OF THE PREFERRED EMBODIMENTS

The features of the exemplary embodiments described in the following can be combined with one another insofar as this is not explicitly indicated otherwise.

Figure 1:
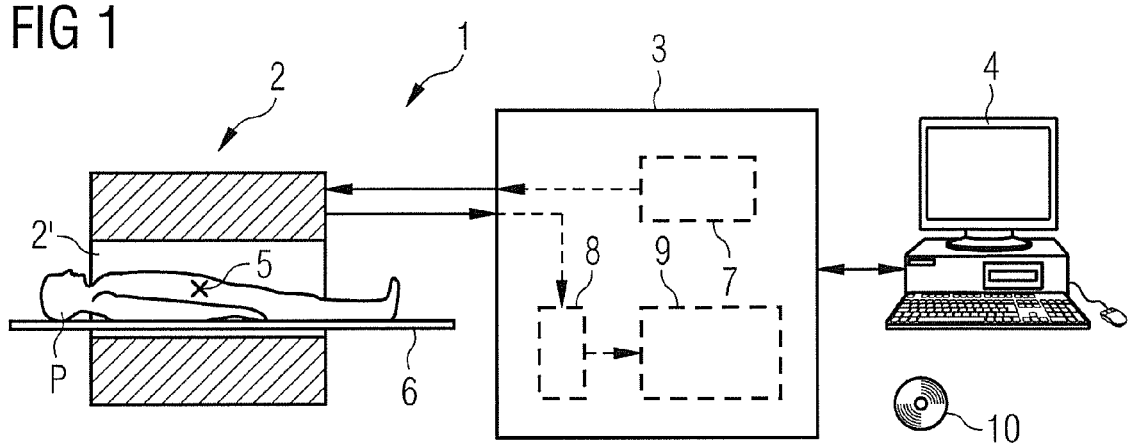
FIG. 1 schematically illustrates of a magnetic resonance device according to an exemplary embodiment.

FIG. 1 is a schematic representation of a magnetic resonance (MR) device 1 according to one exemplary embodiment. The MR device 1 has a scanner (data acquisition device) 2, a control device 3 and an evaluation computer 4. The scanner 2 has one or more coil arrangements with which the magnetic fields required for a data acquisition can be generated in a measurement space 2'. The isocenter of the B0 field is designated 5. The scanner 2 can include gradient coils with which gradient fields for a phase-sensitive flow measurement or an angiography can be activated in order to achieve a phase coding of velocities. The scanner 2 can be configured so that the data acquisition that is required for a phase-sensitive flow measurement or angiography can be implemented by shifting time-variable, in particular bipolar gradient fields. Furthermore, the scanner 2 has a support device 6 on which an examination subject P is supported while a data acquisition is conducted in the measurement space 2'.

The control device 3 has an activation unit 7, a receiver device 8 and an evaluation device 9. During a phase-sensitive flow measurement the receiver device 8 receives data acquired by the scanner 2, wherein the scanner 2 and the support device 6 (in the form of a table) are activated by the activation unit 11 such that MR data are acquired in a measurement volume which [sic] a segment of the inside of the body of the examination subject P (for example a patient) supported on the support device 6. The evaluation device 9 and/or a separate evaluation computer 4 can conduct an additional processing of the data received by the receiver device 8, for example via a translation of the received data from k-space into position [classical; three-dimensional] space in order to allow a graphical presentation. The determination of phase correction values as it is described in the following can be conducted by an arbitrary suitable computer or a combination of such computers, for example by the evaluation device 9, the evaluation computer 4 or the combination of evaluation device 9 and the evaluation computer 4. A corresponding software code that initiates the execution of the described method steps on this computer can be stored on a data medium 10, for example.

The MR device 1 is configured to conduct a data acquisition for multiple different segments, for example multiple slices of the examination subject P. In particular, the MR device 1 can be set up in order to respectively implement a measurement for a plurality of partial volumes or slices of the examination subject P, in which measurement velocities of the regions of the examination subject that are covered in the data acquisition affect the phase measured for the pixels. The data acquisition can take place slice by slice, wherein the position of the slices is selected so that a volumetric coverage of a volume segment of the examination subject P takes place. The data acquisition for different segments (for example multiple different slices of the examination subject P) can take place in coordination with the activation of the support device 6. The activation unit 7 can thus monitor the position of the support device 6 such that each of the slices for which a data acquisition takes place is respectively positioned in an environment of the isocenter 5 (for example less than 5 cm from the isocenter 5) during the data acquisition.

The operation of the MR device 1 according to various exemplary embodiments is described in detail with reference to FIG. 2-9.

Figure 2:
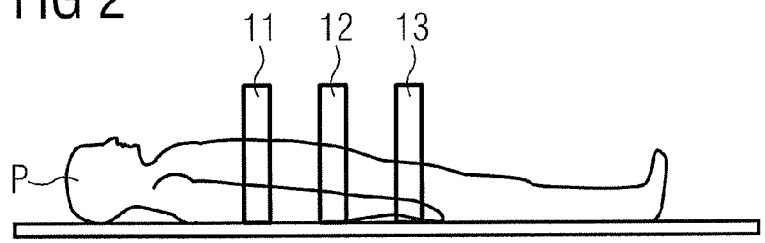
FIG. 2 schematically illustrates an examination subject to explain an exemplary embodiment.

FIG. 2 is a schematic representation of the examination subject P. Multiple slices 11, 12 and 13 for which a data acquisition is conducted with the MR device 1 are schematically shown.

Figure 3:
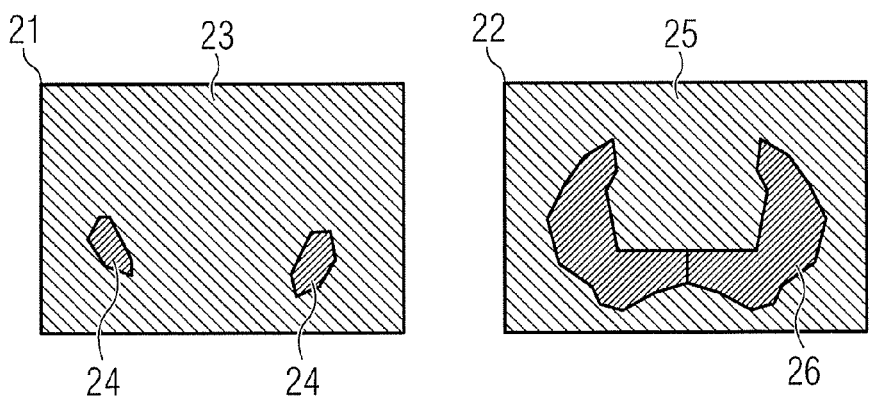
FIG. 3 schematically illustrates MR image data to explain an exemplary embodiment.

FIG. 3 is a schematic representation of first MR image data 21 that represent the first slice 11 and of second MR image data 22 that represents the second slice 12. The first MR image data 21 possess regions 24 with a plurality of pixels that represent essentially stationary tissue and additional pixels 23 that do not represent essentially stationary tissue. Similarly, the second MR image data 22 possess a region 26 with a plurality of pixels that represent essentially stationary tissue and additional pixels 25 that do not represent essentially stationary tissue. The phase values at the pixels 24 and at the pixels 26 that represent essentially stationary tissue contain no or only a slight phase shift due to a possible movement of the corresponding tissue. These phase values at the pixels 24, 26 that represent essentially stationary tissue deliver information about the background phase at the corresponding image coordinates. Such a background phase can be caused by eddy currents or gradient field nonlinearities, for example.

In the distribution of pixels 24 shown as an example in FIG. 3 (which pixels 24 represent essentially stationary tissue) the pixels 24 are concentrated in small regions of the MR image data 21. An extrapolation of the phase values for a low number of pixels 24 that represent essentially stationary tissue could lead to an estimation of the background phase curve with unsatisfactory precision at the other pixels 23 of the MR image data 21.

According to various exemplary embodiments of the invention, the background phase curve or phase correction values approximating the background phase curve for the first MR image data 21 are determined not only using the phase values and coordinates of the first pixels 24 that represent essentially stationary tissue in the first MR image data 21 but also additionally based on the phase values and possibly the coordinates of additional pixels 26 that represent essentially stationary tissue in at least one additional set of MR image data 22. In the MR image data 22 (which are shown as an example) that represent a different segment of the examination subject, a larger number of second pixels 26 that represent essentially stationary tissue are present that can be used as well to determine phase correction values for the first MR image data 21.

Figure 4:
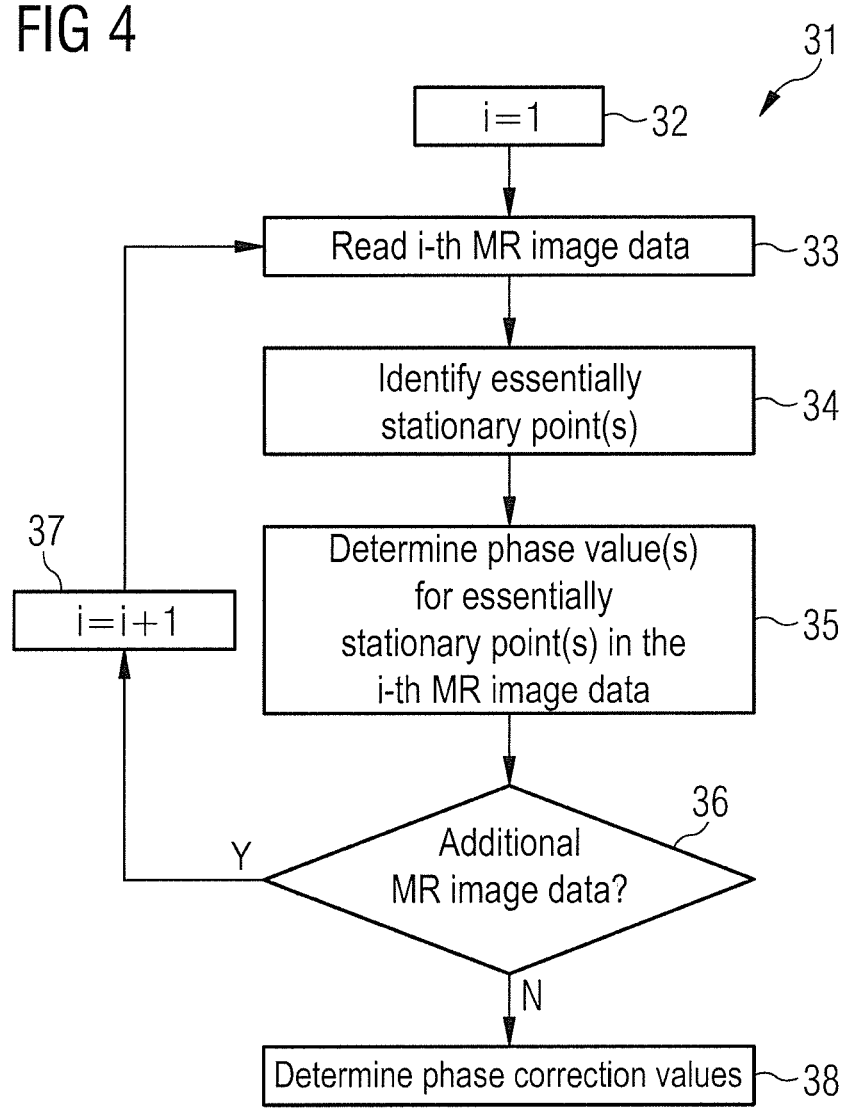
FIG. 4 is a flow chart of the inventive method according to one exemplary embodiment.

FIG. 4 is a flow chart presentation of a method 31 according to one exemplary embodiment. In the method multiple sets of MR image data are used that represent different segments (for example different slices) of an examination subject in order to determine phase correction values. The phase correction values can be used to reduce the background phase effects in multiple data of the MR image data. The method 31 can be implemented by the evaluation device 9 and/or the evaluation computer 4 of the MR device 1.

At 32 an iterative implementation of the subsequent Steps 33-36 is initialized for multiple sets of MR image data that represent different segments of the examination subject, in that an index i=1 is set.

The i-th MR image data are read out at 33. The reading of the i-th MR image data can also contain a processing of the data acquired with the scanner 2.

A pixel that represents essentially stationary tissue or multiple pixels that represent essentially stationary tissue is/are identified in the i-th MR image data at 34. Various methods that are described in detail further below can be applied for this.

The phase value that is associated with the pixel identified at 34 or the phase values that are associated with the pixels identified at 34 is/are identified at 35.

At 36 it is checked whether additional MR image data are present. In the event that this is the case, a new iteration is started via the incrementing of the index at 37.

In the event that the identification of pixels that represent essentially stationary tissue and the determination of the corresponding phase values for all MR image data to be included have concluded, phase correction values are determined at 38. The phase correction values are determined depending on the phase values determined in the various MR image data for the pixels that correspond to essentially stationary tissue. An embodiment of Step 38 in a method according to an exemplary embodiment will be described in more detail with reference to FIG. 5.

The identification of the pixels that represent essentially stationary tissue that takes place at 34 can take place in various ways in method 31. According to one embodiment, the i-th MR image data can respectively comprise MR image data acquired in a time sequence, which MR image data represent the same subject segment. The MR image data can thus reflect the chronological variation of the velocities in the respective subject segment in the manner of a cine acquisition. The phase for a pixel with the coordinates x, y and for a data acquisition at the point in time $t_j$ is designated with $\phi(x, y, t_j)$. To determine the pixels that represent essentially stationary tissue, the time variance of the phase in the corresponding pixel can be determined with the coordinates x, y for each of the pixels, $$\sigma(x, y) = \sqrt{\frac{1}{N-1} \sum_{j=1}^{N} (\varphi(x, y, t_j) - \bar{\varphi}(x, y))^2}, \quad (1)$$

wherein N is the total number of exposures of the respective subject segment in the cine image sequence, j is an index for the acquisition points in time and $\bar{\phi}(x,y)$ is the average time value of the phase at the pixel x, y over the exposures of the cine image sequence. Naturally, instead of the variance in the phase the variance of the velocity determined from the phase can be used. The variance according to Equation (1) can be compared with a threshold as a criterion for whether a pixel represents essentially stationary tissue. The threshold can be a fixed value that is used for the identification of the pixels that represent essentially stationary tissue in various MR image data that represent different subject segments. However, other possibilities for the determination of the pixels that represent essentially stationary tissue can likewise be used in the methods and devices according to the different exemplary embodiments. For example, cross-correlations of the phase at different pixels can be determined and be used to determine the stationary pixels.

Figure 5:
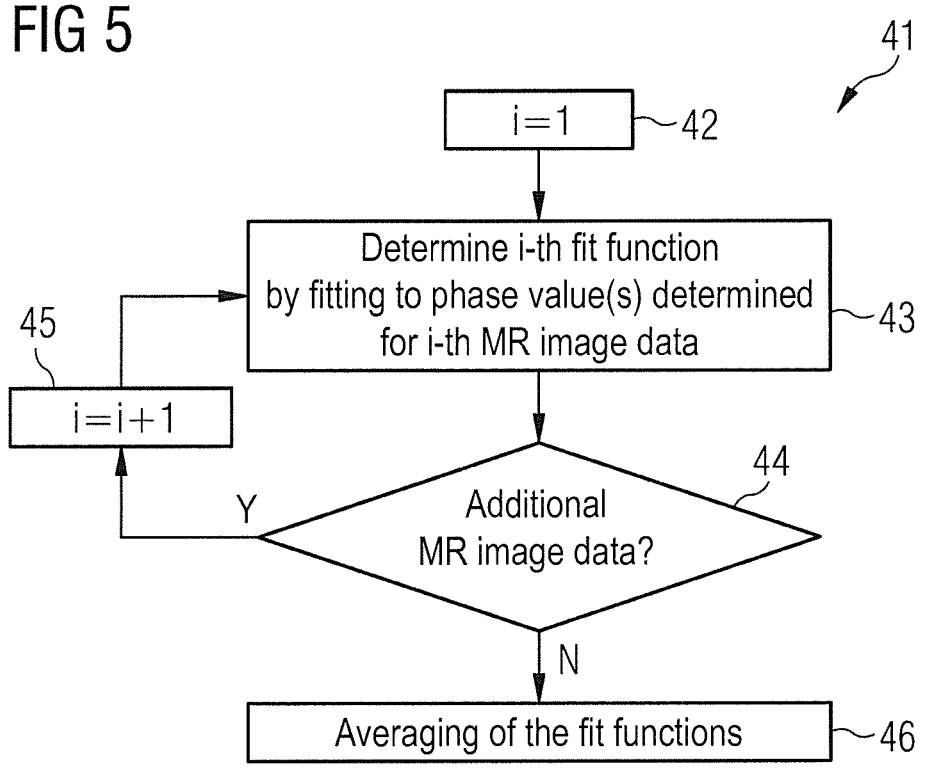
FIG. 5 is a flow chart of a procedure to determine the phase correction values in the inventive method according to one exemplary embodiment.

FIG. 5 is a flow chart presentation of a procedure 41 to determine phase correction values according to one exemplary embodiment. The procedure can be used to implement the step 38 of the method 31 from FIG. 4. The procedure 41 can be implemented by the evaluation device 9 and/or the evaluation computer 4 of the MR device 1.

At 32 an iterative implementation of the following Steps 43 and 44 is initialized for multiple sets of MR image data that represent different segments of the examination subject, in that an index i=1 is set.

At 33 a fit function is determined that is associated with the i-th MR image data. The fit function can be determined in that parameters of a function (which is linear or quadratic in the two image coordinates, for example) are established by fitting. The fit function is thereby determined for the i-th MR image data by fitting to those pixels that represent essentially stationary tissue, the i-th MR image data and the phase values associated with these.

At 34 it is checked whether a fit function can additionally be determined for additional MR image data. In the event that this is the case, a new iteration is started via the incrementing of the index at 45.

In the event that fit functions have already been determined for the different MR image data that should be used in the determination of the phase correction values, an averaging of the fit functions takes place at 46. An arithmetic mean can be calculated over the various fit functions in the averaging, for example.

The averaged fit function calculated at 46, which fit function was determined based on the phase values for stationary points in different MR image data that represent different subject segments, can subsequently be used for a phase correction in at least one set (and typically multiple sets) of MR image data.

The determination of the fit function at 43 can take place in different ways. According to one exemplary embodiment, an Ansatz for a fit function of the form $$S(x, y) = \sum_{l=0}^{k} \sum_{m=0}^{l} a_{lm} \cdot x^{l-m} \cdot y^{m} \quad (2)$$

will be selected, wherein $a_{lm}$ are parameters of the fit function and x and y designate the pixel coordinates in the MR image data. In Equation (2), k is a maximum order of the fit function. k can be suitably established, wherein the establishment for the i-th MR image data can also be selected depending on the number and/or distribution of pixels that correspond to essentially stationary tissue. In practice, a fit function with linear (k=1) or quadratic (k=2) dependency on the pixel coordinates can frequently be selected. Insofar as only one pixel that represents essentially stationary tissue is present in MR image data, k=0 must be selected. In the event that at least three pixels that represent essentially stationary tissue have been identified for the corresponding MR image data, the three parameters $a_{00}$, $a_{10}$ and $a_{01}$ of a linear fit function can be determined. In the event that at least six pixels that represent essentially stationary tissue have been identified for the corresponding MR image data, the six parameters $a_{00}$, $a_{10}$, $a_{01}$, $a_{20}$, $a_{21}$, $a_{22}$ of a quadratic fit function can be determined. Since the fit function according to Equation (2) is linear in the parameters $a_{lm}$, the values for the parameters $a_{lm}$ of the fit function can be determined with the least squares method.

In this way, depending on the i-th MR image data a fit function associated with this can be determined that suitably interpolates the measured background phase values at the pixels that represent essentially stationary tissue. As was already explained with reference to Step 46 of the procedure from FIG. 5, an averaging of the various fit functions that respectively approximate the curve of the background phase can subsequently be implemented. In this way the stability with which the curve of the background phase is determined can be increased. The function determined via averaging can be evaluated at all pixels of the first and second MR image data, for example, in order to determine phase correction values for the respective pixels.

It should be understood that the order of steps that is shown in FIGS. 4 and 5 is only schematic and can be suitably modified. For example, the determination of the fit function can also be implemented immediately after Step 35 in the method 31 so that only an averaging of the fit functions is implemented to determine the phase correction values in Step 38.

In further exemplary embodiments, Step 38 of the method from FIG. 4 can also be implemented in a different way as explained with reference to FIG. 5. For example, using the stationary pixels identified in Steps 34 and 35 and the phase values associated with these, those pixel coordinates can be determined at which a stationary pixel is respectively present in a predetermined number of MR image data (for example in two or three MR image data that represent two or three different subject segments). The corresponding phase values for the stationary pixels at these coordinates can then be initially averaged before a fit function is determined by fitting to the averaged phase values.

For the stability (achieved with the method according to various exemplary embodiments) in the determination of the background phase curve it is advantageous if the determination of the background phase curve is conducted based on a plurality of MR image data that—although they represent different segments of the examination subject—are respectively positioned in a predetermined sub-volume of the measurement space 2' in the data acquisition. This can be achieved via a selection of the MR image data such that the positions of the segments of the examination subject (respectively at the point in time of the data acquisition) exhibit at most a predetermined distance from one another, and/or via a corresponding movement of the support device 6 relative to the scanner 2 for the implementation of the data acquisition.

In particular, the method to determine the background phase curve can advantageously be applied to MR image data that have been acquired using the method described in co-pending application entitled "Method And Device For Phase-Sensitive Flow Measurement By A Magnetic Resonance System" (Ser. No. 12/975,840, Filed Dec. 22, 2010). In this method a volume segment of the examination subject for which a data acquisition should be implemented is broken down into multiple sub-segments that can in turn have multiple slices, wherein a positioning of the take of the MR device is set so that the data acquisition for every slice takes place in an environment of the isocenter.

Figure 6:
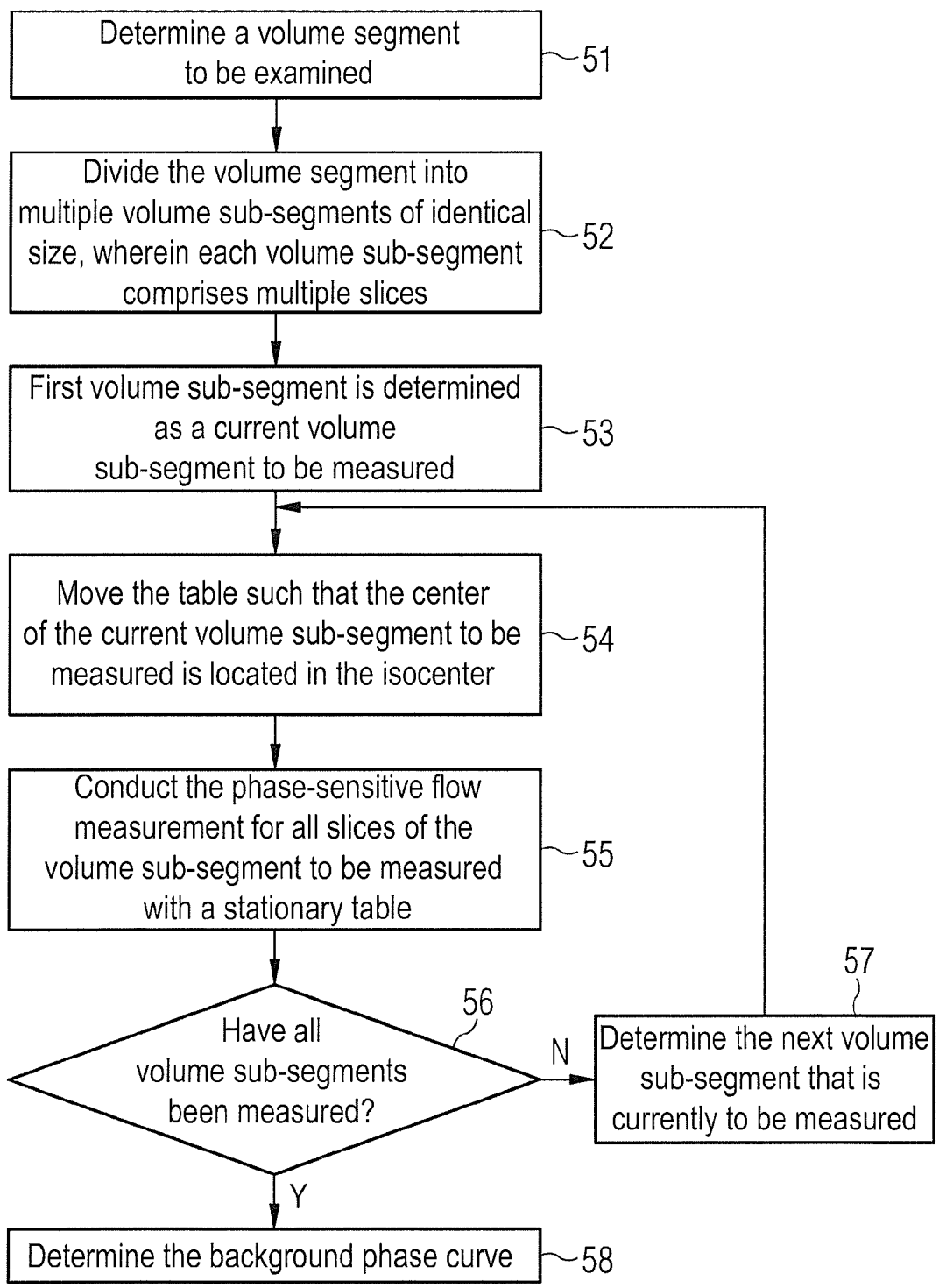
FIG. 6 is a flow chart of a procedure for data acquisition in a method in the inventive method according to an exemplary embodiment.

FIG. 6 is a flow chart of a procedure with which such a data acquisition can be implemented.

At 51 a volume segment is determined in which a flow measurement is to be implemented.

At 52 this volume segment is divided up into multiple volume sub-segments. The volume sub-segments can respectively have the same volume. Each of these volume sub-segments can comprise multiple slices in order to allow the per-slice implementation of the flow measurement.

At 53 a first volume sub-segment which can be located at an edge of the volume segment is determined as a first, current volume sub-segment to be measured.

At 54 the table 6 of the MR device 1 is moved such that the center of the current volume sub-segment to be measured is located at or near to the isocenter 5 of the MR device.

At 55 the phase-sensitive flow measurement is implemented for every slice within the current volume sub-segment to be measured. The table 6 can thereby be held between the measurements at the same position that are implemented for different slices of the sub-segment. The size of the volume sub-segments is thereby dimensioned such that the MR measurement of each slice is conducted with sufficient density at the isocenter 5 so that only small background phase effects occur and other locally varying influences (such as gradient distortions) are likewise small.

At 56 it is checked whether all volume sub-segments of the volume segment have been measured.

If not all volume sub-segments of the volume segment have been measured, the procedure branches to Step 57 and determines the next volume sub-segment to be measured, which is arranged next to the volume sub-segment that is presently measured. The procedure is subsequently continued again at Step 54.

If the check conducted at 56 yields that all volume sub-segments of the volume segment have already been measured, the procedure branches to Step 58. At 58 the background phase curve can then be determined, for example using the method described with reference to FIGS. 4 and 5.

MR image data that represent the various slices of the different volume sub-segments can thereby be used to determine the background phase curve in that, for each of the slices, those pixels that represent essentially stationary tissue are determined, their phase values are identified and phase correction values are determined depending on this information. The phase correction values can in turn be applied to the MR image data for each of the slices in order to implement a phase correction.

Figure 7:
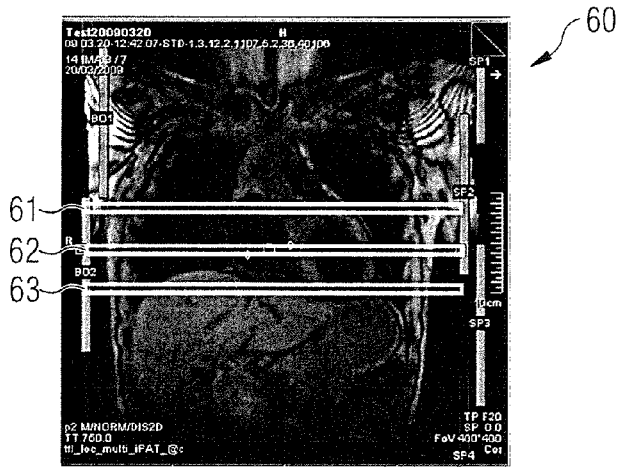
FIG. 7 schematically illustrates an examination subject to explain an exemplary embodiment of the invention.
Figure 8:
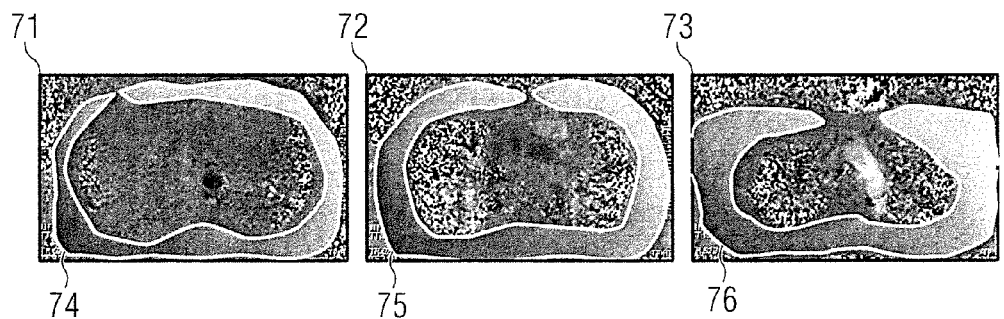
FIG. 8 schematically illustrates MR image data of the examination subject from FIG. 7.
Figure 9:
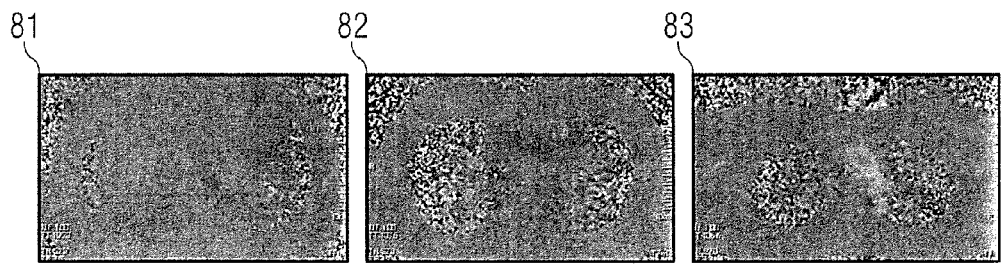
FIG. 9 schematically illustrates the MR image data of FIG. 8 after a phase correction.

The method and the device according to various exemplary embodiments should be further illustrated using FIG. 7-9.

FIG. 7 is a longitudinal section depiction 60 of an examination subject. A first slice 61, a second slice 62 and a third slice 63 are segments of the examination subject for which a phase-sensitive flow measurement or angiography should be implemented, for example.

FIG. 8 shows first MR image data 71 that represent the first slice 61, second MR image data 72 that represent the second slice 62, and third MR image data 73 that represent the third slice 63. The data acquisition can ensue such that the first slice 61 is positioned at the isocenter 5 given a first data acquisition to determine the first MR image data 71; such that the second slice 61 is positioned at the isocenter 5 given a second data acquisition to determine the second MR image data 72; and such that the third slice 63 is positioned at the isocenter 5 given a third data acquisition to determine the third MR image data 73. The phase information is represented as a grey scale in FIG. 8. According to one method according to an exemplary embodiment, the first pixels 74 that represent essentially stationary tissue in the first slice 61 are identified in the first MR image data 71 and the associated phase values are determined using the first MR image data 71. The second pixels 75 that represent essentially stationary tissue in the second slice 62 are identified in the second MR image data 72 and the associated phase values are determined using the second MR image data 72. The third pixels 76 that represent essentially stationary tissue in the third slice 63 are identified in the third MR image data 73 and the associated phase values are determined using the third MR image data 73. The proportion and the distribution of the pixels 74, 75 or, respectively, 76 that represent essentially stationary tissue vary between the different MR image data.

As was described with reference to FIG. 1-5, the pixels 74, 75 and 76 that represent essentially stationary tissue and the associated phase values are used in order to determine phase correction values that approximate the curve of the background phase. The phase correction values that are determined in this way are applied to both the first MR image data 71 and to the second and third image data 72 and 73. For example, the phase correction values can be subtracted per pixel from the phase values in all MR image data 71-73.

FIG. 8 shows phase-corrected first MR image data 81 that were obtained via subtraction of the phase correction values from the first MR image data 71, phase-corrected second MR image data 82 that were obtained via subtraction of the phase correction values from the first MR image data 72, and phase-corrected third MR image data 83 that were obtained via subtraction of the phase correction values from the third MR image data 73. The background phase effects are typically reduced in the phase-corrected MR image data 81-83. The phase-corrected MR image data 81-83 can be used to determine flow profiles, for angiography or for other purposes.

Exemplary embodiments of the invention allow the determination of the background phase curve in MR image data. Methods and devices according to exemplary embodiments can be used in order to reduce background phase effects. Fields of application exist in phase-sensitive flow measurements or in angiography, for example.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method to determine a background phase curve in magnetic resonance (MR) image data obtained from an examination subject in a phase-sensitive magnetic resonance data acquisition procedure wherein said MR image data are acquired from respective segments of the examination subject, said MR image data representing a plurality of pixels, said method comprising the steps of:

in a computerized processor, determining, in first MR image data of said MR image data, which represent a first of said segments of said examination subject, at least one first phase value respectively for at least one first pixel that represents substantially stationary tissue in said first MR image data;

determining a phase correction value for said first MR image data dependent on said at least one first phase value;

in said computerized processor, determining, for second MR image data of said MR image data, which represent a second of said segments of said examination subject different from said first segment, at least one second phase value for at least one second pixel that represents substantially stationary tissue in said second MR image data; and in said computerized processor, determining phase correction values depending on said at least one first phase value and said at least one second phase value.

2. A method as claimed in claim 1 wherein said first segment is a first slice of the examination subject and said second segment is a second slice of the examination subject, said first slice and said second slice being different from each other.

3. A method as claimed in claim 2 wherein said first slice and said second slice are offset relative to each other in an axial direction of the subject.

4. A method as claimed in claim 2 wherein said first slice and said second slice are offset relative to each other along a longitudinal direction of a vessel in said subject.

5. A method as claimed in claim 1 comprising determining said phase correction values using at least one fit function dependent on said at least one first phase value and said at least one second phase value.

6. A method as claimed in claim 1 comprising determining said phase correction values by determining a first fit function dependent on said at least one first phase value and a second fit function dependent on said at least one second phase value, and determining said phase correction values from said first fit function and said second fit function.

7. A method as claimed in claim 6 comprising determining said phase correction values by averaging said first fit function and said second fit function.

8. A method as claimed in claim 1 comprising identifying at least one additional set of said MR image data, which represent at least one additional segment of the subject that differs from said first segment and said second segment and, for said at least one additional set of said MR image data, identifying at least one additional pixel that represents substantially stationary tissue in said at least one additional set of said MR image data, and determining at least one additional phase value associated with said at least one additional pixel, and determining said phase correction values also dependent on said at least one additional phase value.

9. A method as claimed in claim 1 comprising also determining phase correction values for pixels in at least one of said first MR image data and said second MR image data that do not represent substantially stationary tissue.

10. A method as claimed in claim 1 comprising, in said computerized processor, implementing a phase correction of said first MR image data and said second MR image data using the determined phase correction values.

11. A method as claimed in claim 10 comprising determining a flow profile of a flow represented in said first and second MR image data, dependent on at least one of the phase-corrected first MR image data and the phase-corrected second MR image data.

12. A method as claimed in claim 1 comprising acquiring said first MR image data in a first data acquisition and acquiring said second MR image data in a second data acquisition, with a spacing between a position of the first segment in the first data acquisition and a position of the second segment in the second data acquisition being less than a predetermined threshold.

13. A method as claimed in claim 12 comprising executing said first data acquisition to obtain said first segment in a region of an isocenter of the magnetic resonance data acquisition device, and executing the second data acquisition to acquire the second segment of the examination subject also in said region of said isocenter of said MR device.

14. A method as claimed in claim 1 comprising acquiring said first MR image data in a first data acquisition and acquiring said second MR image data in a second data acquisition with the examination subject being moved relative to the MR data acquisition device between the first data acquisition and the second data acquisition.

15. A method as claimed in claim 14 comprising executing said first data acquisition to obtain said first segment in a region of an isocenter of the magnetic resonance data acquisition device, and executing the second data acquisition to acquire the second segment of the examination subject also in said region of said isocenter of said MR device.

16. A non-transitory computer-readable storage medium encoded with programming instructions, said storage medium being loaded into a computerized control and evaluation system of a magnetic resonance system, and said programming instructions causing said computerized control and evaluation device to:
in first MR image data of said MR image data, which represent a first of a plurality of segments of said examination subject, determine at least one first phase value respectively for at least one first pixel that represents substantially stationary tissue in said first MR image data;
determine a phase correction value for said first MR image data dependent on said at least one first phase value;
for second MR image data of said MR image data, which represent a second of said plurality of segments of said examination subject different from said first segment, determine at least one second phase value for at least one second pixel that represents substantially stationary tissue in said second MR image data; and
determine phase correction values depending on said at least one first phase value and said at least one second phase value.

17. A magnetic resonance (MR) apparatus comprising:
an MR data acquisition unit configured to execute a phase-sensitive MR data acquisition procedure to acquire MR image data from respective segments, in a plurality of segments, of an examination subject, said MR image data representing a plurality of pixels;
a computerized processor configured to determine, in first MR image data of said MR image data, which represent a first of said segments of said examination subject, at least one first phase value respectively for at least one first pixel that represents substantially stationary tissue in said first MR image data;
said computerized processor being configured to determine a phase correction value for said first MR image data dependent on said at least one first phase value;
said computerized processor being configured to determine, for second MR image data of said MR image data, which represent a second of said segments of said examination subject different from said first segment, at least one second phase value for at least one second pixel that represents substantially stationary tissue in said second MR image data; and
said computerized processor being configured to determine phase correction values depending on said at least one first phase value and said at least one second phase value.

18. A magnetic resonance apparatus as claimed in claim 17 wherein said magnetic resonance data acquisition device is configured to acquire said first MR image data to represent a first slice of the subject and to acquire the second MR image data to represent a second slice of the examination subject, said first and second slices being different from each other.

* * * * *